(12) United States Patent
Yamada

(10) Patent No.: US 6,769,469 B2
(45) Date of Patent: Aug. 3, 2004

(54) PROCESS FOR MOUNTING SEMICONDUCTOR DEVICE AND MOUNTING APPARATUS

(75) Inventor: Yukio Yamada, Tochigi (JP)

(73) Assignee: Sony Chemicals Corp., Tokyo (JP)

( * ) Notice: Subject to any disclaimer, the term of this patent is extended or adjusted under 35 U.S.C. 154(b) by 100 days.

(21) Appl. No.: 09/928,516

(22) Filed: Aug. 14, 2001

(65) Prior Publication Data

US 2002/0029857 A1 Mar. 14, 2002

Related U.S. Application Data

(62) Division of application No. 09/631,282, filed on Aug. 3, 2000, now Pat. No. 6,340,607.

(30) Foreign Application Priority Data

Aug. 9, 1999 (JP) ............................................ 11-225275

(51) Int. Cl.⁷ .............................. H05K 3/00; H05K 3/10
(52) U.S. Cl. ...................... 156/556; 156/580; 228/44.7; 29/829; 29/832; 257/783
(58) Field of Search ................................. 156/556, 580, 156/219, 152, 292, 293; 29/829, 832; 228/9, 44.7, 179.1, 180.21, 180.22, 235.1; 257/782, 783, 778; 438/106, 119, 125, 118

(56) References Cited

U.S. PATENT DOCUMENTS

| | | | | |
|---|---|---|---|---|
| 5,662,763 A | * | 9/1997 | Yamanaka | ............. 156/358 |
| 5,985,064 A | * | 11/1999 | Sato | ............... 156/64 |
| 6,037,192 A | * | 3/2000 | Witzman et al. | ............. 438/118 |
| 6,349,872 B1 | * | 2/2002 | Yamada et al. | ............. 228/175 |
| 6,409,866 B1 | * | 6/2002 | Yamada | ............... 156/219 |
| 6,531,026 B1 | * | 3/2003 | Takeichi et al. | ............. 156/282 |

FOREIGN PATENT DOCUMENTS

| | | | | | |
|---|---|---|---|---|---|
| EP | 1187181 A2 | * | 3/2002 | ......... | H01L/21/00 |
| JP | 11016949 A | * | 1/1999 | ......... | H01L/21/60 |
| JP | 11204591 A | * | 7/1999 | ......... | H01L/21/603 |
| JP | 11330152 A | * | 11/1999 | ......... | H01L/21/60 |

* cited by examiner

Primary Examiner—Sue A. Purvis
(74) Attorney, Agent, or Firm—Oliff & Berridge, PLC

(57) ABSTRACT

A process for mounting a semiconductor device and a mounting apparatus whereby electrodes of a fine-pitch semiconductor device and a wiring board can be surely connected to each other. A process for mounting a semiconductor device by electrically connecting an electrode of the semiconductor device 4 to an electrode of a wiring board by using an anisotropic conductive adhesive film having conductive particles dispersed in an insulating adhesive, which process comprising: the step of tentatively thermocompression bonding a conductive particle-free filmy insulating adhesive onto a wiring board 22 to thereby form an insulating adhesive layer 23; the step of forming a concave 23a of a predetermined size in said insulating adhesive layer 23 by using a compression bonding head 2 provided with a pressing chip 21 at a predetermined position; the step of putting in the concave 23a of said insulating adhesive layer 23 an anisotropic conductive adhesive film of a predetermined size; and the step of mounting a predetermined IC chip 11 at a predetermined position of the compression bonding head 2 and then positioning said IC chip 11 and thermocompression bonding to said wiring board 22.

5 Claims, 4 Drawing Sheets

PROCESS FOR MOUNTING SEMICONDUCTOR DEVICE AND MOUNTING APPARATUS

This is a Division of application Ser. No. 09/631,282 filed Aug. 3, 2000 now U.S. Pat. No. 6,340,607. The entire disclosure of the prior application is hereby incorporated by reference herein in its entirety.

FIELD OF THE INVENTION

This invention relates to a process for mounting a semiconductor device on a wiring board. More particularly, it relates to a process for mounting a semiconductor device whereby a bare chip is directly mounted on a substrate by using an anisotropic conductive adhesive film.

BACKGROUND OF THE INVENTION

To mount a bare chip directly on a wiring board such as a print wiring board, there has been known a process with the use of an anisotropic conductive adhesive film having conductive particles dispersed in a binder.

In this process for mounting a bare chip on a wiring board by using an anisotropic conductive adhesive film, it has been a practice to form protruding bump electrodes in the Semiconductor device side or in the wiring board side.

This is because, in case of bumpless connection without forming any bump, conductive particles sometimes come into contact with the scribe line at the edge of the Semiconductor device thereby causing a short-circuit.

In recent years, there has been required fine pitching between the electrodes of a wiring board of the above type. To satisfy this requirement for fine pitching, the connection electrode area between the wiring board and the Semiconductor device should be reduced.

To achieve fine pitching in practice in the conventional mounting process, it is necessary to surely provide conductive particles between the electrodes. To ensure the existence of the conductive particles, it is suggested, for example, that the conductive particle diameter is further reduced so that a larger number of conductive particles can be contained in the binder of the anisotropic conductive adhesive film.

However, an increase in the content of the conductive particles in the binder is accompanied by an increase in the viscosity of the anisotropic conductive adhesive film and, in its turn, a decrease in the fluidity of the conductive particles in the binder. As a result, it becomes difficult to uniformly disperse the conductive particles in the binder. At the same time, there arises another problem that the insulation properties of the anisotropic conductive adhesive film are deteriorated.

When the conductive particle diameter is reduced, on the other hand, the absolute deformation caused by crushed conductive particles in the step of the thermocompression bonding becomes smaller and thus the irregularity in the bump electrode height cannot be compensated thereby. In such a case, it is feared that some of the electrodes of the wiring board and the Semiconductor device undergo connection failure and thus the conduction reliability is lowered.

As discussed above, fine pitching cannot be sufficiently established in practice in the conventional mounting processes.

To solve these problems, there is pointed out a process which comprises tentatively thermocompression bonding a conductive particle-free insulating adhesive film to a wiring board, then forming a concave in the insulating adhesive film by using, for example, a press head almost as large as the outer size of an Semiconductor device, and then putting an anisotropic conductive adhesive film in the concave and thermocompression bonding the same.

By using this mounting process, conductive particles can be densely provided between the Semiconductor device and the wiring board and thus connection electrodes can be electrically connected to each other without fail while maintaining the content and diameter of the conductive particles at the levels comparable to the existing cases.

In this case, however, it is necessary to provide a press head for forming the concave in addition to a compression bonding head, which makes the constitution of the apparatus complicated.

In case of mounting Semiconductor devices of various sizes on a wiring board as in a multi chip module (MCM), it is necessary to prepare plural press heads corresponding to the outer shape of each Semiconductor device, which makes the apparatus constitution further complicated. In this case, there arise another problems that an apparatus of a larger size is needed and a longer time is consumed in replacing the press heads during the mounting operation.

SUMMARY OF THE INVENTION

An object of the present invention, which has been completed to solve these problems encountering in the conventional art, is to provide a process for mounting a semiconductor device and a mounting apparatus whereby electrodes of a fine-pitch semiconductor device and a wiring board can be surely connected to each other.

Another object of the present invention is to provide a process for mounting a semiconductor device and a mounting apparatus whereby the occurrence of a short-circuit between the semiconductor device and the wiring board can be prevented in a bumpless IC chip.

Another object of the present invention is to provide a process for mounting a semiconductor device and a mounting apparatus whereby semiconductor devices of various types can be easily and quickly mounted on a wiring board.

According to the present invention, which has been made to achieve the above-mentioned objects, provides a process for mounting a semiconductor device by electrically connecting an electrode of the semiconductor device to an electrode of a wiring board by using an anisotropic conductive adhesive film having conductive particles dispersed in an insulating adhesive, which process involves: the step of tentatively thermocompression bonding a conductive particle-free filmy insulating adhesive onto a wiring board to thereby form an insulating adhesive layer; the step of forming a concave of a predetermined size in the insulating adhesive layer by using a compression bonding head provided with a pressing chip at a predetermined position; the step of putting in the concave of the insulating adhesive layer an anisotropic conductive adhesive film of a predetermined size; and the step of mounting a predetermined semiconductor device at a predetermined position of the compression bonding head and then positioning the semiconductor device and thermocompression bonding to the wiring board.

In thermocompression bonding with the use of an anisotropic conductive adhesive film, it is generally observed that conductive particles tend to run off together with the insulating adhesive toward the edge of the Semiconductor device. In the case of the present invention, however, the conductive particles tending to run off along the Semiconductor device edge are blocked by the brim of the concave formed in the insulating adhesive layer. Thus, the conductive particles scarcely flow in the direction of the Semiconductor device edge.

According to the present invention, therefore, the conductive particles can be densely held between the semiconductor device and the wiring board. Thus, plural conductive particles can be provided on each electrode at an extremely high probability and connection electrodes can be surely electrically connected to each other without fail even in a case where connection electrodes are located at very small intervals.

According to the present invention, moreover, no conductive particle reaches the scribe line of the Semiconductor device edge and, therefore, there arises no short-circuit between the scribe line and the wiring board.

According to the present invention, furthermore, a concave is formed in the insulating adhesive layer by using a press head provided with a pressing chip of a predetermined size. Accordingly, it is unnecessary to use many press heads respectively depending on the outer shape of Semiconductor devices, even in case where Semiconductor devices of various types are to be mounted. Thus, the apparatus constitution can be simplified.

In this case, it is also effective in the present invention that the press head serves both as the compression bonding head in tentatively thermocompression bonding the insulating adhesive, forming the concave and thermocompression bonding the semiconductor device with anisotropic conductive adhesive film.

According to the present invention, the press head for forming the concave can be omitted, which contributes to the further simplification and down-sizing of the apparatus constitution.

On the other hand, the preset invention relates to an apparatus for mounting a semiconductor device on a wiring board provided with a compression bonding head for electrically connecting an electrode of the semiconductor device to an electrode of the wiring board, characterized by having a press head provided with holding means whereby a pressing chip for forming a concave of a predetermined size in the insulating adhesive layer in the wiring board side and the semiconductor device are held respectively.

According to the present invention, the above-described process of the present invention can be easily carried out.

In this case, the apparatus constitution of the present invention can be further simplified and down-sized by constructing the compression bonding head as serving both as the press head.

Moreover, the apparatus constitution of the present invention can be further simplified and down-sized by constructing the holding means as holding respectively the pressing chip and the semiconductor device in a removal manner.

As the holding means in this case, the apparatus of the present invention may be constructed as sucking the air via a suction hole formed in the compression bonding part of the compression bonding head, for example.

Owing to the above-described constitution, the pressing chip can be easily and quickly attached/removed by switching the air suction. In addition, it also becomes possible to mount members of various shapes onto the compression bonding head.

It is also effective that, in the present, the face of the pressing chip in contact with the insulating adhesive layer is releasable from the insulating adhesive.

According to the present invention, the releasable face of pressing chip prevent stripping the insulating adhesive layer from the wiring board caused by adhering to the pressing chip.

BRIEF DESCRIPTION OF THE DRAWINGS

FIG. 1(a): an illustration which shows a pressing chip sucked on a compression bonding head.

FIG. 1 (b): an illustration which shows an IC chip sucked on a compression bonding head.

FIG. 1(c): an enlarged view of the part A in FIG. 1(b).

Figure 1A:
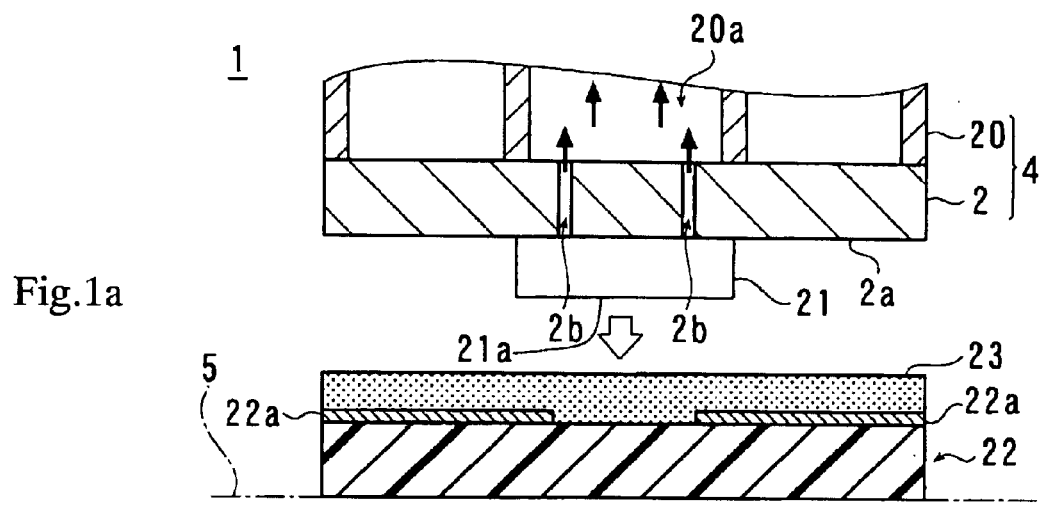
FIGS. 1(a) to 1(c) are schematic illustrations showing an example of the constitution of the apparatus for mounting a semiconductor device of the present invention.

In these drawings, each numerical symbol has the following meaning:

2, 2A: compression bonding head

2a: press face (compression bonding part)

2b suction hole

11 IC chip (semiconductor device)

21: pressing chip 23 insulating adhesive layer

23a: concave 24 anisotropic conductive adhesive film

25: conductive particle.

DETAILED DESCRIPTION OF THE INVENTION

Now, preferred embodiments of the process for mounting a semiconductor device and a mounting apparatus according to the present invention will be illustrated in detail by reference to the drawings.

Figure 1B:
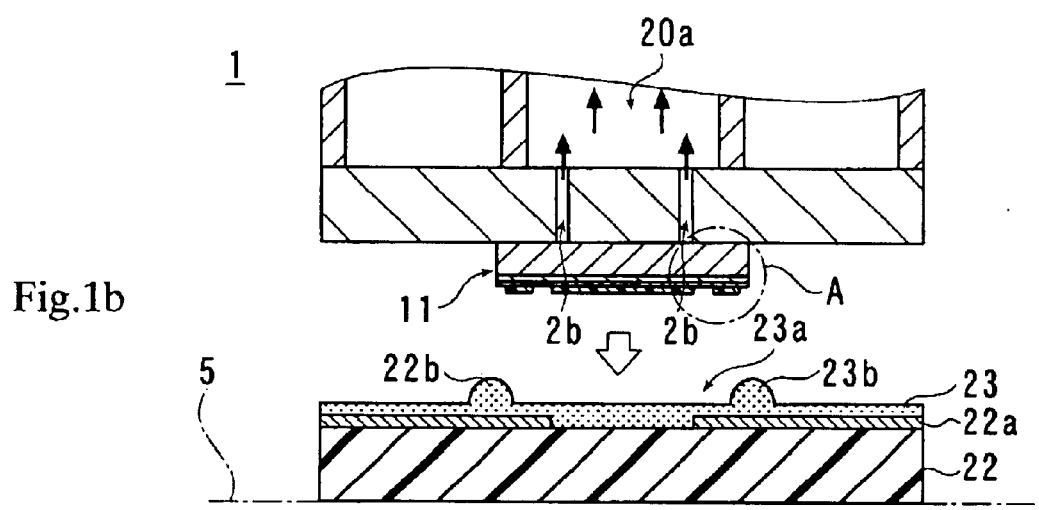
Figure 1C:
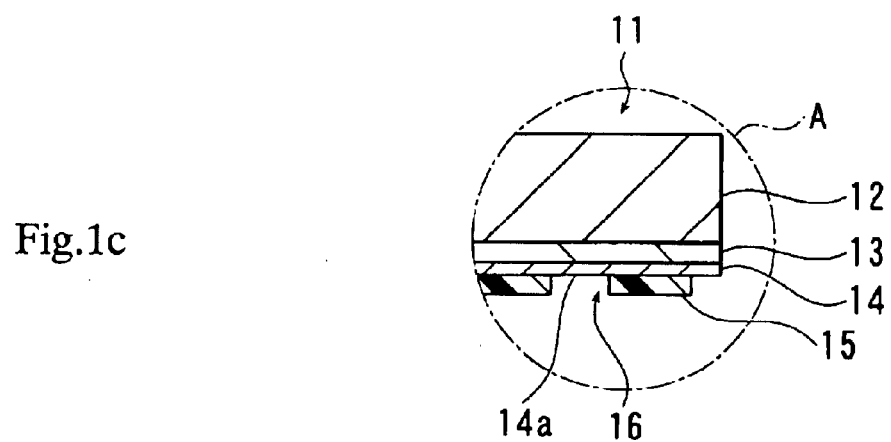

FIGS. 1(a) to 1(c) are schematic illustrations showing an example of the constitution of the apparatus for mounting a semiconductor device of the present invention. FIG. 1(a) is an illustration which shows a pressing chip sucked on a compression bonding head. FIG. 1(b) is an illustration which shows an IC chip sucked on a compression bonding head. FIG. 1(c) is an enlarged view of the part A in FIG. 1(b).

As the IC chip 11 to be used in the present invention, either an IC chip having bumps or a bumpless one is usable. To illustrate this embodiment, a bumpless IC chip 11 is employed by way of example.

As FIGS. 1(a) and 1(b) show, the mounting apparatus 1 of this embodiment of the present invention is provided with a compression bonding unit 4 having a compression bonding head 2 for pressing the IC chip 11 onto a wiring board 22. This compression bonding head 2, which is fixed to the main body (not shown) of the apparatus with a fixture 20, is constructed so that it can be vertically moved against a table 5 on which the wiring board 22 is placed.

The compression bonding head 2 has a heater (not shown) enclosed therein. Plural suction holes 2b are formed on the press face (compression bonding part) 2a of the compression bonding head 2 as will be described hereinafter.

In this embodiment, a hollow suction part 20a is formed in the fixture 20. This suction part 20a is connected to the suction hole 2b of the compression bonding head 2 and, on the other hand, also connected to a vacuum pump which is not shown in the drawing. By operating this vacuum pump, the pressure within the suction part 20a is reduced. Thus, the pressing chip 21 or the IC chip 11 is sucked and held on the compression bonding head 2, as FIGS. 1(a) and 1(b) show.

In this embodiment of the present invention, the compression bonding head 2 has such a size as exceeding the largest one among the IC chips 11 and the pressing chips 21 to be sucked thereon.

The suction holes 2b of the compression bonding head 2 are located on the press face 2a so that the suction holes are involved in the area smaller than the smallest one among the IC chips 11 and the pressing chips 21 to be sucked.

Although the area and the number of the suction holes 2b of the compression bonding head 2 are not particularly restricted, it is favorable, from the viewpoint of ensuring the suction of the IC chip 11 or the pressing chip 21, to provide from 1 to 5 suction holes each having a pore area of from 0.01 to 5 mm$^2$ for one chip.

The suction holes 2b of the compression bonding head 2 are not particularly restricted in shape. Namely, holes of arbitrary shapes (circular, square, etc.) may be formed.

In the IC chip 11 employed in this embodiment, a predetermined circuit pattern 14 is formed on an oxide film (SiO$_2$) 13 of a silicone wafer 12, as FIG. 1(c) shows. A protective oxide film (a passivation film) 15 provided with a contact hole 16 is further formed on the pad 14a of this circuit pattern 14.

FIGS. 2(a) to (c) and FIGS. 3(a) to 3(c) are processing diagram showing examples of the process for mounting a semiconductor device of the present invention.

Figure 2A:
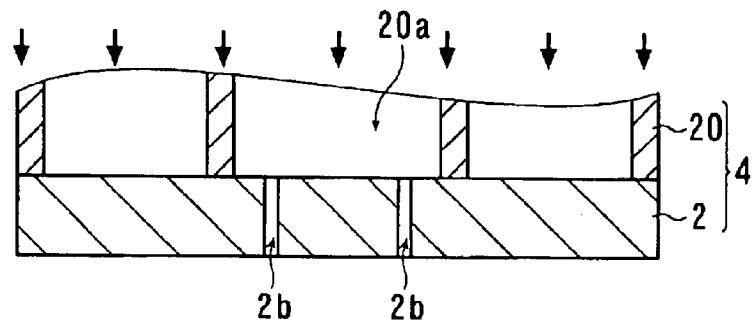
FIGS. 2(a) to 2(c) are processing diagram (No. 1) showing an example of the process for mounting a semiconductor device according to the present invention.
Figure 2B:
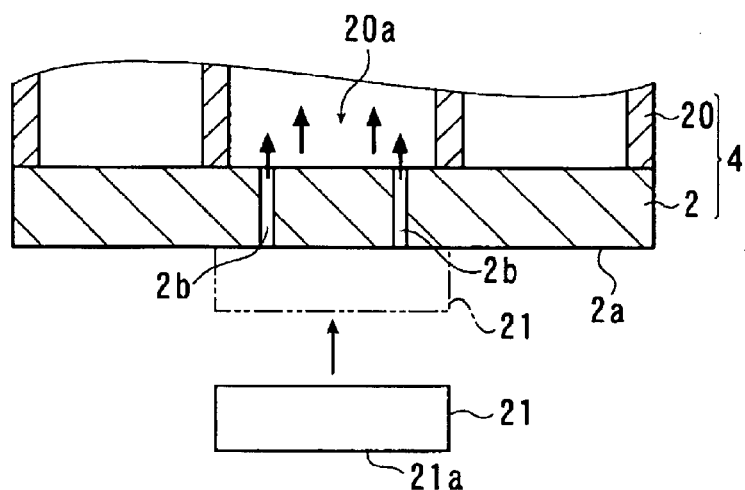

In this embodiment, as shown in FIG. 2(a), a conductive particle-free filmy insulating adhesive is first placed on a wiring board 22 having a predetermined circuit pattern formed thereon in such a manner as to cover a connection electrode 22a. Followed by tentative thermocompression bonding by using a compression bonding head 2 heated to about 80° C. under, for example, a pressure of 3 kgf/cm$^2$ for 2 seconds, thereby forming an insulating adhesive layer 23, as shown in FIG. 2(a).

From the viewpoint of preventing the run-off of the conductive particles 25, it is preferable that the insulating adhesive to be used in the present invention has a melt viscosity larger than that of the insulating adhesive 24a in the anisotropic conductive adhesive film 24 as will be described hereinafter.

It is also preferable that this insulating adhesive has a melt viscosity, in particular, a minimum melt viscosity (i.e., the lowest melt viscosity in the state where the viscosity is reduced to the lowest level during the thermocompression bonding) of from $1 \times 10^6$ to $1 \times 10^9$ mPa Es, still preferably from $5 \times 10^6$ to $5 \times 10^8$ mPa Es.

When the minimum melt viscosity of the insulating adhesive is less than $1 \times 10^6$ mPa Es, there arises a problem of run-off of the conductive particles. When the minimum melt viscosity thereof exceeds $1 \times 10^9$ mPa Es, on the other hand, there arises another problem of inhibiting the conduction between connection electrodes.

Examples of the insulating adhesive include a mixture of a solid epoxy resin of bisphenol A type with a liquid epoxy resin and a mixture of a thermoplastic resin such as phenoxy resin, acrylic resin, polyester resin, etc. with an epoxy resin.

Then the inside of the suction part 20a of the compression bonding head 2 is sucked by driving the vacuum pump as described above. Thus, the pressing chip 21 is sucked to the press face 2a of the compression bonding head 2. In this step, the pressing chip 21 is pressed onto a protrusion part (not shown) and the image of the pressing chip 21 is subjected to digital processing, thereby positioning the pressing chip 21.

It is preferable in the pressing chip 21 to be used in the present invention that at least the face 21a in contact with the insulating adhesive layer 23 is releasable from the insulating adhesive.

Examples of the pressing chip 21 satisfying the above requirement include a chip prepared by molding polytetrafluoroethylene (PTFE) resin and a chip prepared by release-processing the surface of an aluminum chip with the use of silicone.

From the viewpoint of preventing the compression bonding head 2 from staining, it is preferable that the pressing chip 21 has a thickness exceeding the thickness of the insulating adhesive layer 23.

More particularly speaking, it is preferable that the thickness of the pressing chip 21 ranges form 0.1 to 5 mm, in case where the thickness of the insulating adhesive layer is from 5 to 100 pm.

It is also preferable that the pressing chip 21 has a size of 1.5 to 0.5 times, still preferably 1 to 0.7 times to the outer size of the IC chip 11.

When the pressing chip 21 has a size 0.5 times or less than the outer size of the IC chip 11, there arises a problem that a concave, which will be described hereinafter, is formed inside the electrode (bump) and thus the conductive particles cannot be electrically connected to the electrode. When the pressing chip 21 has a size 1.5 times or larger than the outer size of the IC chip 11, on the other hand, it becomes impossible to establish the merit of increasing the number of the conductive particles on the pad 14a by blocking the conductive particles or the merit of preventing the conductive particles from reaching the scribe line, as will be described hereinafter.

Figure 2C:
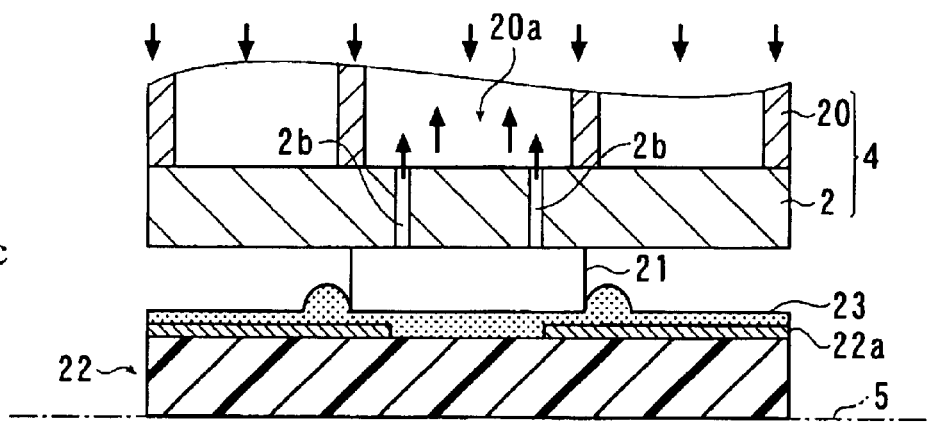

Subsequently, the thermocompression bonding unit 4 is lowered and hot-press is carried out by using a compression bonding head 2 heated to about 80° C. under, for example, a pressure of 3 kgf/cm$^2$ for 2 seconds, thereby forming a concave 23a having almost the same size as the outer size of the pressing chip 21 in the insulating adhesive layer 23, as shown in FIG. 2(c).

Figure 3A:
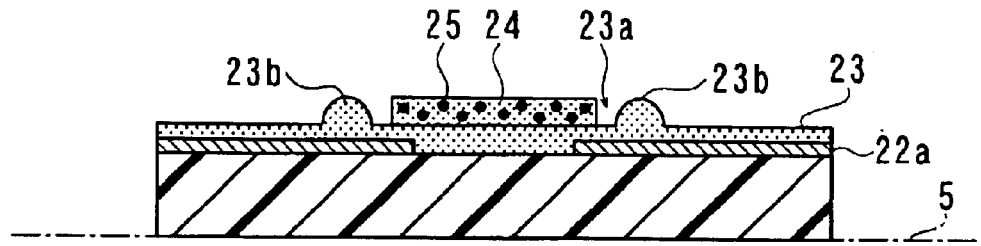
FIGS. 3(a) to 3(c) are processing diagram (No. 2) showing another example of the process for mounting a semiconductor device according to the present invention.

Next, an anisotropic conductive adhesive film 24 is put into this concave 23a followed by tentative thermocompression bonding, as FIG. 3(a) shows. This anisotropic conductive adhesive film 24 has conductive particles 25 dispersed in the insulating adhesive. This anisotropic conductive adhesive film 24 is preliminary cut into a size somewhat smaller than the outer size of the pressing chip 21.

In this embodiment of the present invention, a brim 23b is formed around the concave 23a by the procedure as described above. As FIG. 3(a) shows, it is preferable that the height of the brim 23b (i.e., the depth of the concave 23a) is less than the thickness of the IC chip 11 (the distance to the bump of the IC chip 11, if formed) but more than the outer diameter of the conductive particles 25 in the anisotropic conductive adhesive film 24.

When the depth of the concave 23a of the insulating adhesive layer 23 is less than the outer diameter of the conductive particles 25, there arises a problem that the run-off of the conductive particles 25 cannot be sufficiently prevented in the step of the thermocompression bonding. When the depth is more than the thickness of the IC chip 11, on the other hand, it is feared that the heated compression bonding head 2 might be stained by the insulating adhesive resin squeezed out from the IC chip 11.

It is preferable that the inner wall of the brim 23b of the concave 23a is located inside the scribe line (not shown) but outside the outmost edge of the pad 14a of the IC chip 11.

When the inner wall of the brim 23b reaches the scribe line of the IC chip 11, it is feared that the conductive particles 25 might come into contact with the scribe line so as to cause short-circuit. When the inner wall of the brim 23b reaches the pad 14a of the IC chip 11, on the other hand, there arises a problem that only a small number of the conductive particles 25 come into contact with the pad 14a and thus the conduction reliability is lowered.

From the viewpoint of ensuring a sufficient conduction reliability, it is preferable that the average particle diameter of the conductive particles 25 ranges from 1 to 10 μm, still preferably from 2 to 8 μm.

It is also preferable that the conductive particles 25 are dispersed in the insulating adhesive at a ratio of from 1 to 15% by volume, still preferably from 3 to 15% by volume.

When the content of the conductive particles 25 is less than 1% by volume, there arises a problem that the electrical connection between the pad 14a of the IC chip 11 and the connection electrode 22a of the wiring board 22 cannot be surely established and thus the conduction resistance is increased. When the content of the conductive particles 25 exceeds 15% by volume, on the other hand, there arises another problem that the conductive particles 25 aggregate together and thus the insulation resistance between electrodes adjacent to each other is lowered.

Figure 3B:
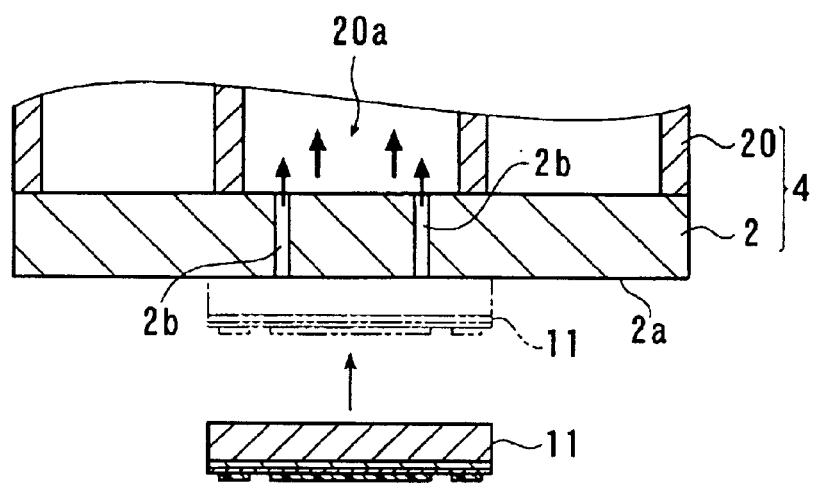

In this embodiment, the concave 23a is formed in the insulating adhesive layer 23 with the use of the pressing chip 21. Then the operation with the vacuum pump is stopped and thus the pressing chip 21 is stripped from the compression bonding head 2. Subsequently, the IC chip 11 is sucked onto the press face 2a of the compression bonding head 2, as FIG. 3(b) shows, and the IC chip 11 is positioned as in the case of the pressing chip 21.

Figure 3C:
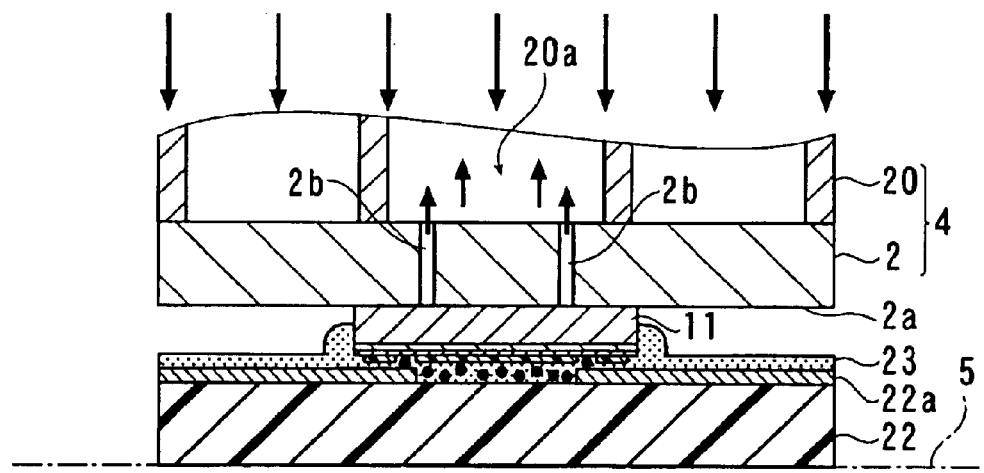

After positioning the IC chip 11 to the wiring board 22, the compression bonding unit 4 is lowered and the IC chip 11 is thermocompression bonded by using the compression bonding head 2 heated to about 180° C. under a pressure of, for example, 1000 kgf/cm² for 20 seconds, as FIG. 3(c) shows.

Thus, the anisotropic conductive adhesive film 24 and the insulating adhesive layer 23 are crushed by the IC chip 11. The conductive particles 25 come into contact with the connection electrode 22a of the wiring board 22 and the pad 14a of the IC chip 11 and thus the IC chip 11 is electrically connected to the wiring board 22.

In the embodiment of the present invention in this case, the conductive particles 25 tending to run-off toward the edge of the IC chip 11 are blocked by the brim 23b of the concave 23a formed in the insulating adhesive layer 23. Thus, the conductive particles scarcely flow toward the edge of the IC chip 11.

In the embodiment, therefore, the conductive particles 25 can be densely held between the IC chip 11 and the wiring board 22. Thus, plural conductive particles 25 can be provided on the connection electrode 22a of the wiring board 22 and the pad 14a of the IC chip 11 at an extremely high probability so as to electrically connect the connection electrode to the IC chip without fail even in a case where the connection electrodes are located at very small intervals.

According to this embodiment of the present invention, moreover, no conductive particle 25 reaches the scribe line at the edge of the IC chip 11. Thus, there arises no short-circuit between the scribe line and the wiring board 22.

In this embodiment, the IC chip 11 and the pressing chip 21 are removable from the compression bonding head 2. Owing to this construction, it is unnecessary to provide an additional press head for forming the concave, which contributes to the simplification and down-sizing of the mounting apparatus 1.

In this embodiment, furthermore, the IC chip 11 and the pressing chip 21 are sucked onto the compression bonding head 2 by sucking the air. Thus, the IC chip 11, etc. can be easily and quickly attached and removed by switching the suction. In addition, it is thus possible to suck IC chips 11 of various shapes onto the compression bonding head 2.

In this embodiment, moreover, at least the face 21 in contact with the insulating adhesive layer 23 is releasable from the insulating adhesive. Owing to this construction, the releasable press face 21a of pressing chip 21 prevent stripping the insulating adhesive layer 23 from the wiring board 22 caused by adhering to the pressing chip 21.

Figure 4:
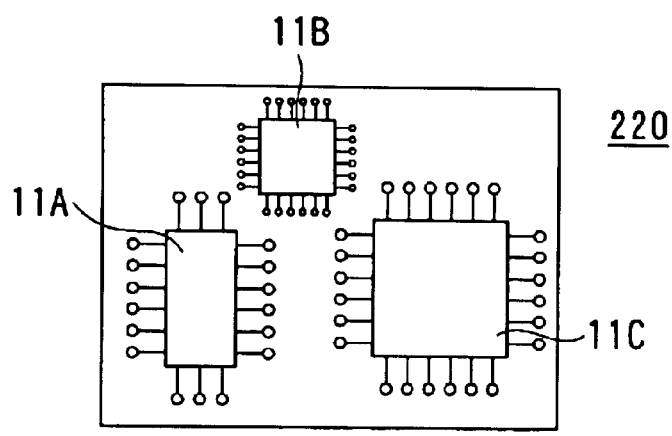
FIG. 4 is a plan view of an example of a wiring board having semiconductor devices of various types mounted thereon.

FIG. 4 is a plan view showing an example of a wiring board having IC chips of various types mounted thereon (a multi chip module). FIG. 5 is a schematic illustration showing the main part of another embodiment of the present invention.

As FIG. 4 shows, three types of IC chips 11A, 11B and 11C differing in outer shape from each other are mounted on this wiring board 220.

Figure 5A:
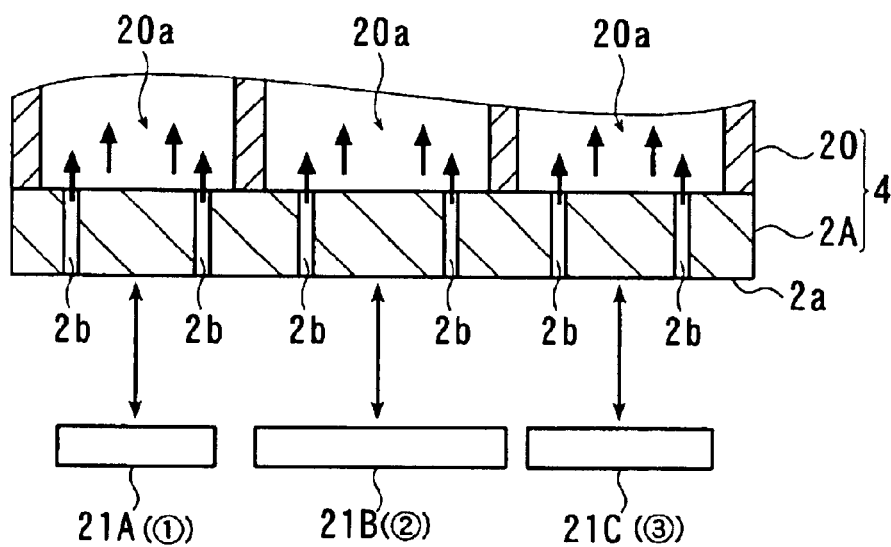
FIG. 5(a) and FIG. 5(b) are a schematic illustration showing the main part of another embodiment of the present invention.
Figure 5B:
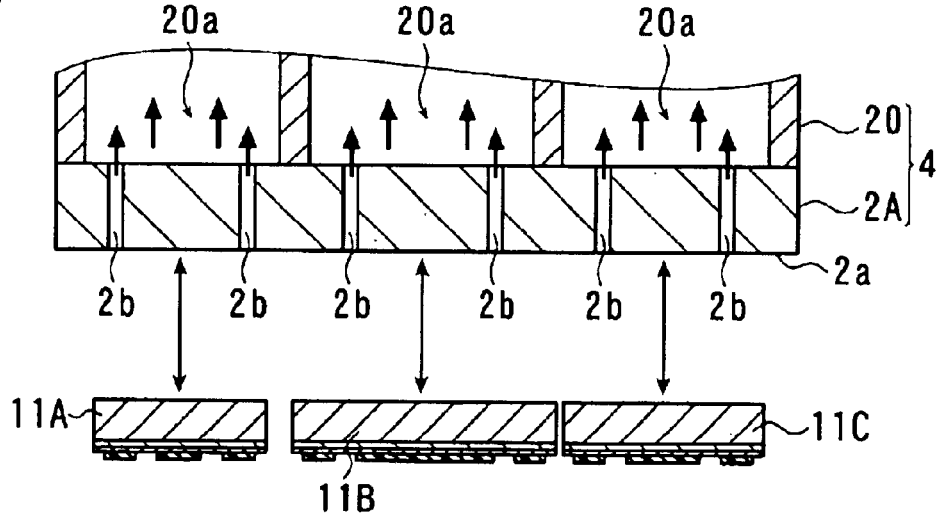

When these three types of IC chips 11A, 11B and 11C other are mounted on the wiring board 220, use is made of a compression bonding head 2A provided with suction holes 2b at the positions respectively corresponding to the IC chips 11A, 11B and 11C, as FIGS. 5(a) and 5(b) show.

Each suction part 20a formed in the fixture 20 of the main body of the apparatus is connected to the suction hole 2b of the compression bonding head and, on the other hand, also connected to a vacuum pump (not shown), as in the case of the above-described embodiment of the present invention.

In this embodiment, first to third pressing chips 21A, 21B and 21C, each satisfying the requirements as described above, and anisotropic conductive adhesive films (not shown) are prepared respectively for the IC chips 11A, 11B and 11C.

After forming a predetermined insulating adhesive layer, the first to third pressing chips 21 are sucked on the compression bonding head 2A of the mounting apparatus, as shown in FIG. 5(a). Next, concaves are formed in the insulating adhesive layer as in the above-described process and then the pressing chips 21A, 21B and 21C are stripped from the compression bonding head 2A.

After putting anisotropic conductive adhesive films (not shown) in each concave in the insulating adhesive layer, the first to third IC chips 11A to 11C are sucked onto the compression bonding head 2 and subjected to thermocompression bonding. Next, the first to third IC chips 11 are stripped from the compression bonding head 2A.

In this embodiment, the first to third pressing chips 21A, 21B and 21C and the first to third IC chips 11A, 11B and 11C are attached and removed from the single compression bonding head. Thus, it is unnecessary to replace pressing chips and compression bonding heads from IC chip to IC chip, and IC chips of various types can be surely mounted on the wiring board 220 within a short time. According to this embodiment, moreover, the apparatus constitution can be simplified and down-sized.

While preferred embodiments of the present invention has been described, it is to be understood that the invention is not restricted thereto and many modifications and variations thereof are possible.

For example, use is made in the above embodiments a single compression bonding head from which pressing chips and IC chips are removable. However, the present invention is not restricted to this case but use can be made of, for example, heads respectively for sucking pressing chips and IC chips. To simplify and down-size the apparatus constitution, it is favorable to construct that pressing chips and IC chips are removable from a single compression bonding head.

The present invention is also applicable to mounting of semiconductor devices having bumps in various shapes.

EXAMPLES

Now, Examples and Comparative Example of the present invention will be described in detail.

Example 1

As a TEG for evaluation, use was made of a rigid substrate obtained by forming a copper (Cu) pattern (width: 18 μm, pitch: 150 μm) on a heat-resistant glass cloth base epoxy resin copper clad laminate (FR-4) of 0.7 mm in thickness followed by plating with nickel/gold. As IC chips, chip A (6 mm×6 mm), chip B (3 mm×6 mm) and chip C (3.3 mm×3.3 mm) provided with electrodes of 150 μm pitch (bumpless) were prepared.

On the other hand, chip (1) (5.7 mm×5.7 mm), chip (2) (2.7 mm×5.7 mm) and chip (3) (3.0 mm×3.0 mm) made of polytetrafluoroethylene (PTFE) resin with a thickness of 1 mm were employed as the pressing chips.

As the anisotropic conductive adhesive film, use was made of SCFP20626™ (manufactured by SONY CHEMICALS). As the conductive particle-free insulating adhesive, use was made of a film (thickness 15 μm) obtained by removing conductive particles from the above-described SCFP20626™ (manufactured by SONY CHEMICALS).

First, the conductive particle-free insulating adhesive film was cut into pieces corresponding to the IC chips A to C and then tentatively thermocompression bonded at 80° C. under a pressure of 3 kgf/cm² for 2 seconds.

Then the base film of the insulating adhesive film was released and the pressing chips (1) to (3) were sucked on the compression bonding head while maintaining at 80° C. When the surface of the insulating adhesive film was thermocompressed at 80° C. under a pressure of 3 kgf/cm² for 2 seconds, a concave of about 10 μm in depth were formed in each insulating adhesive film.

Next, an anisotropic conductive adhesive film was put into each concave and tentatively thermocompression bonded. After positioning each IC chip, thermocompression bonding was performed at 180° C. under a pressure of 1000 kgf/cm²/bump for 20 seconds.

Example 2

Connection was performed by using an anisotropic conductive adhesive film as in Example 1 but using a chip (3.0 mm×3.0 mm) made of silicone-surface-processed aluminum (thickness: 1 mm) as the pressing chip.

Comparative Example

Connection was performed by using an anisotropic conductive adhesive film as in Example 1 but using a chip (3.0 mm×3.0 mm) made of aluminum (thickness: 1 mm) as the pressing chip.

(Evaluation)

Evaluation was made on the releasability of pressing chip from the insulating adhesive in each of the above Examples and Comparative Example. Table 1 summarizes the results.

A sample wherein the insulating adhesive layer pressed by the pressing chip was hardly release from the wiring board in the step of forming the concave was referred to as good (O), while a sample wherein the insulating adhesive layer was released from the wiring board was referred to as poor (x).

TABLE 1

Evaluation data on Examples and Comparative Example

|  |  | IC Chip size (mm × mm) | Pressing chip size (mm × mm) | Pressing chip material | Releasability from insulating adhesive film |
|---|---|---|---|---|---|
| Example 1 | Chip (1) | 6.0 × 6.0 | 5.7 × 5.7 | PTFE | O |
|  | Chip (2) | 3.0 × 6.0 | 2.7 × 5.7 | PTFE | O |
|  | Chip (3) | 3.3 × 3.3 | 3.0 × 3.0 | PTFE | O |
| Example 2 |  | 3.3 × 3.3 | 3.0 × 3.0 | silicone-proccessed Al | O |
| Comparative Example |  | 3.3 × 3.3 | 3.0 × 3.0 | Al | X |

As Table 1 shows, the samples of Examples 1 and 2 with the use of the pressing chips made of PTFE and pressing chips surface-processed with silicone showed good releasability from the insulating adhesive layer in the step of forming the concaves.

When the conduction resistance of the connectors of Examples 1 and 2 were measured, the maximal initial resistance was 15 mΩ or less in each case. After performing a pressure cooker test on condition that 121° C. and saturated humidity, 2 atm, the maximal resistance was 50 mΩ or less in each case, thus showing good conduction reliability.

In the sample of Comparative Example, on the other hand, the pressing chip adhered to the insulating adhesive layer and thus the insulating adhesive layer stripped from the wiring board together with the pressing chip after the formation of the concave. In this case, therefore, connection could not be made by using the anisotropic conductive adhesive film.

According to the present invention, plural conductive particles can be provided on each connection electrode at an extremely high probability and connection electrodes can be surely electrically connected to each other without fail even in a case where the connection electrodes are located at very small intervals, as described above.

According to the present invention, moreover, short-circuit between the scribe line and the wiring board can be prevented in a case with the use of a bumpless IC chip.

According to the present invention, moreover, IC chips of various types can be mounted on a wiring board within a short time without resort to a complicated and large-sized apparatus constitution.

What is claimed is:

1. An apparatus for mounting a plurality of semiconductor devices on a wiring board, the apparatus comprising:

a compression bonding head relatively movable to a table on which the wiring board is placed, said compression bonding head having a holding means with a plurality of suction parts for sucking and holding said semiconductor devices thereon, wherein said suction parts are provided at the positions respectively corresponding to said semiconductor devices; and a pressing chip held in the compression bonding head by the holding means for forming a concave area of a predetermined size in an insulating adhesive layer on said wiring board.

2. The apparatus as claimed in claim 1, wherein said holding means are constructed as sucking the air via a plurality of suction holes formed in the compression bonding part of said compression bonding head.

3. The apparatus as claimed in claim 1, further comprising a press head for holding the pressing chip.

4. The apparatus as claimed in claim 1, wherein the pressing chip has an outer size that is 1.5 to 0.5 times the outer size of the semiconductor device.

5. The apparatus of claim 4, wherein the pressing chip is 1.0 to 0.7 times the outer size of the semiconductor device.

* * * * *